US009853247B2

(12) United States Patent
Lee et al.

(10) Patent No.: US 9,853,247 B2
(45) Date of Patent: Dec. 26, 2017

(54) ELECTROPHOSPHORESCENT ORGANIC LIGHT EMITTING CONCENTRATOR

(71) Applicant: The Regents of the University of Michigan, Ann Arbor, MI (US)

(72) Inventors: Jaesang Lee, Ann Arbor, MI (US); Michael Slootsky, Ann Arbor, MI (US); Stephen R. Forrest, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 14/645,045

(22) Filed: Mar. 11, 2015

(65) Prior Publication Data

US 2015/0311475 A1    Oct. 29, 2015

Related U.S. Application Data

(60) Provisional application No. 61/951,019, filed on Mar. 11, 2014.

(51) Int. Cl.
*H01L 51/52*  (2006.01)
*H05B 33/08*  (2006.01)

(52) U.S. Cl.
CPC ...... *H01L 51/5271* (2013.01); *H01L 51/5262* (2013.01); *H05B 33/0896* (2013.01); *H01L 2251/5307* (2013.01); *H01L 2251/5361* (2013.01)

(58) Field of Classification Search
CPC ..... H01L 31/02; H01L 51/52; H01L 51/5275; H01L 51/5271; H01L 27/32

USPC .................. 313/504; 257/13, 21, 76, 88, 89
See application file for complete search history.

(56) References Cited

U.S. PATENT DOCUMENTS

| | | |
|---|---|---|
| 3,978,332 A | 8/1976 | Taltavull |
| 4,161,015 A | 7/1979 | Dey et al. |
| 4,769,292 A | 9/1988 | Tang et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |

(Continued)

FOREIGN PATENT DOCUMENTS

| | | |
|---|---|---|
| WO | 2008057394 | 5/2008 |
| WO | 2010011390 | 1/2010 |

OTHER PUBLICATIONS

National Research Council, Assessment of Advanced Solid-State Lighting. (The National Academies Press, Wash DC,2013); pp. 4, 34, 45, 46, 50, 53, and 60.

(Continued)

*Primary Examiner* — Tung X Le
(74) *Attorney, Agent, or Firm* — Morris & Kamlay LLP

(57) ABSTRACT

Embodiments of the disclosed subject matter provide a device with a base having an opening, and a plurality of organic light emitting devices (OLEDs) disposed on a plurality of substrates and arranged in a light directing structure onto the base, where the opening of the base is a light exit aperture of light output by the plurality of OLEDs.

20 Claims, 16 Drawing Sheets

(56) References Cited

U.S. PATENT DOCUMENTS

| | | |
|---|---|---|
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 7,195,374 B2 | 3/2007 | Saccomanno et al. |
| 7,279,704 B2 | 10/2007 | Walters et al. |
| 7,431,968 B1 | 10/2008 | Shtein et al. |
| 7,968,146 B2 | 6/2011 | Wagner et al. |
| 8,125,138 B2* | 2/2012 | Luttgens .......... H01L 51/5275 313/110 |
| 8,179,034 B2* | 5/2012 | Potts .............. B82Y 20/00 313/504 |
| 8,922,113 B2 | 12/2014 | Forrest et al. |
| 2003/0230980 A1 | 12/2003 | Forrest et al. |
| 2004/0174116 A1 | 9/2004 | Lu et al. |
| 2005/0088084 A1 | 4/2005 | Cok |
| 2009/0225543 A1 | 9/2009 | Jacobson et al. |
| 2010/0019660 A1* | 1/2010 | Lee ............... H01L 51/5203 313/504 |
| 2010/0046210 A1* | 2/2010 | Mathai ............ F21K 9/135 362/147 |
| 2011/0013397 A1* | 1/2011 | Catone ............ F21S 8/086 362/244 |
| 2012/0113632 A1* | 5/2012 | Aoyama ........... F21V 7/00 362/231 |
| 2012/0161610 A1* | 6/2012 | Levermore ........ H01L 51/5275 313/504 |
| 2013/0048940 A1* | 2/2013 | Sills ............. H01L 31/02244 257/13 |

OTHER PUBLICATIONS

Baldo, et al., "Highly efficient phosphorescent emission from organic electroluminescent devices", Nature, vol. 395, pp. 151-154, 1998.

Baldo, et al., "Very high-efficiency green organic light-emitting devices based on electrophosphorescence", Applied Physics Letters, vol. 75, No. 1, pp. 4-6, Jul. 5, 1999.

Bulovic, et al., "Weak microcavity effects in organic light-emitting devices", Phys Rev B. 1998; 58:3730-3740.

Celebi, et al., "Simplified calculation of dipole energy transport in a multilayer stack using dyadic Green's functions", Opt Express. 2007; 15: 1762-1772.

Choi, "Area-scaling of organic solar cells", J Appl Phys. 2009; 106:054507-054516.

Forrest, et al., "Measuring the Efficiency of Organic Light-Emitting Devices", Adv Mater. 2003; 15:1043-1048.

Giebink, "Quantum efficiency roll-off at high brightness in fluorescent and phosphorescent organic light emitting diodes.", Phys Rev B. 2008; 77:235215-235223.

Kroger, et al., "Role of the deep-lying electronic states of MoO 3 in the enhancement of holeinjection in organic thin films", Appl Phys Lett. 2009; 95: 123301-123303.

Lindsey, "Calculating Illuminance at a Point", Applied Illumination Engineering; The Fairmont Press, Inc.; 1997; pp. 215-219.

Moller, et al., "Improved light out-coupling in organic light emitting diodes employing ordered microlens arrays", J Appl Phys. 2002; 91: 3324-3327.

Piliego, et al., "Analysis and control of the active area scaling effect on white organic light emitting diodes towards lighting applications", Appl Phys Lett. 2006; 89: 103514-103516.

Qui, et al., "MoO3 doped 4,4'-N,N'-dicarbazole-biphenyl for low voltage organic light emitting diodes", Appl Phys Lett. 2011; 99: 153305-153307.

Tang, et al., "Organic electroluminescent diodes", Appl Phys Lett. 1987; 51:913-915.

Wang, et al., "Highly simplified phosphorescent organic light emitting diode with > % external quantum efficiency at > 10 , 000 cd / m 2", Appl Phys Lett. 2011; 98: 073310-073312.

Wang, et al., "Snow cleaning of substrates increases yield of large-area organic photovoltaics", Appl Phys Lett. 2012; 101: 133901-133903.

Zhang, et al., "Highly Directional Emission and Beam Steering from Organic Light-Emitting Diodes with a Substrate Diffractive Optical Element", Adv Opt Mater; pp. 343-347; 2014.

* cited by examiner

ELECTROPHOSPHORESCENT ORGANIC LIGHT EMITTING CONCENTRATOR

CROSS-REFERENCE TO RELATED APPLICATIONS

This application claims the benefit of U.S. Provisional Patent Application Ser. No. 61/951,019, filed Mar. 11, 2014, the disclosure of which is incorporated by reference in its entirety.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to luminaire devices having organic light emitting diodes disposed on substrates and arranged in a light directing structure and other devices, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

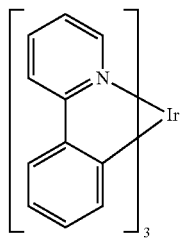

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

Phosphorescent organic light emitting diodes (PHOLEDs) have been used commercially in flat panel displays. More recently, PHOLEDs are finding applications in solid-state lighting due to their color tunability and potentially low cost. For use in general lighting, however, PHOLEDs must operate at a higher luminance (i.e., greater than 3,000 nits) than in displays. To obtain this level of brightness, current densities of greater than 1 mA/cm² are required, which can lead to a reduced device lifetime and efficiency. Moreover, to obtain a desirable light distribution profile for uniform surface illumination, additional optical lighting source solutions are required that often increase the cost and complexity of the fixture.

SUMMARY OF THE INVENTION

An embodiment of the disclosed subject matter provides a device including a base having an opening, and a plurality of organic light emitting devices (OLEDs) disposed on a plurality of substrates and arranged in a light directing structure onto the base, where the opening of the base is a light exit aperture of light output by the plurality of OLEDs.

According to another embodiment, a first device comprising a first organic light emitting device is also provided. The first organic light emitting device can include an anode, a cathode, and an organic layer, disposed between the anode and the cathode. The first organic light emitting device can be arranged in a light directing structure, where an opening of a base of the structure is a light exit aperture of light output by the first organic light emitting device. The first device can be a consumer product, an organic light-emitting device, and/or a lighting panel.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
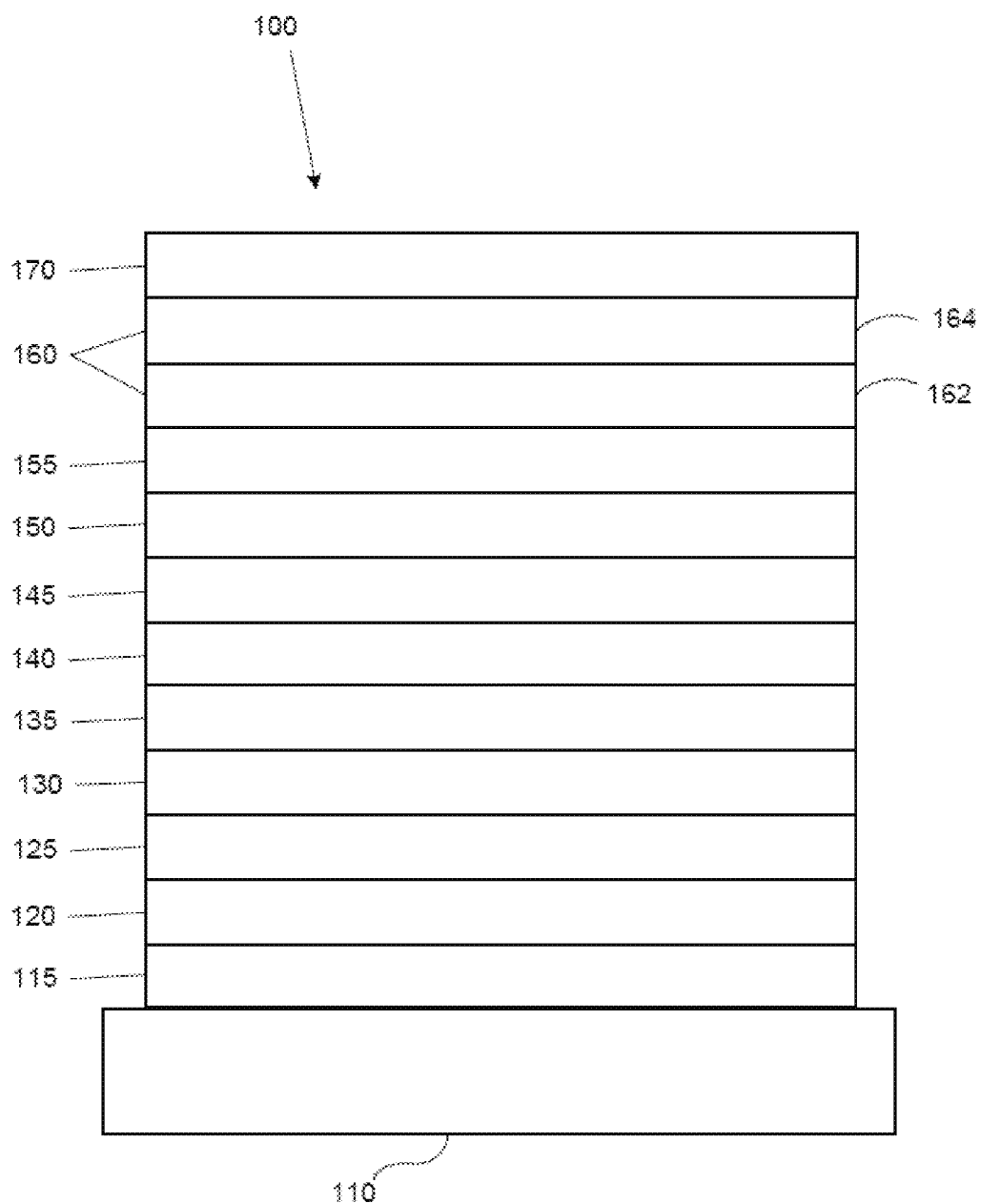
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
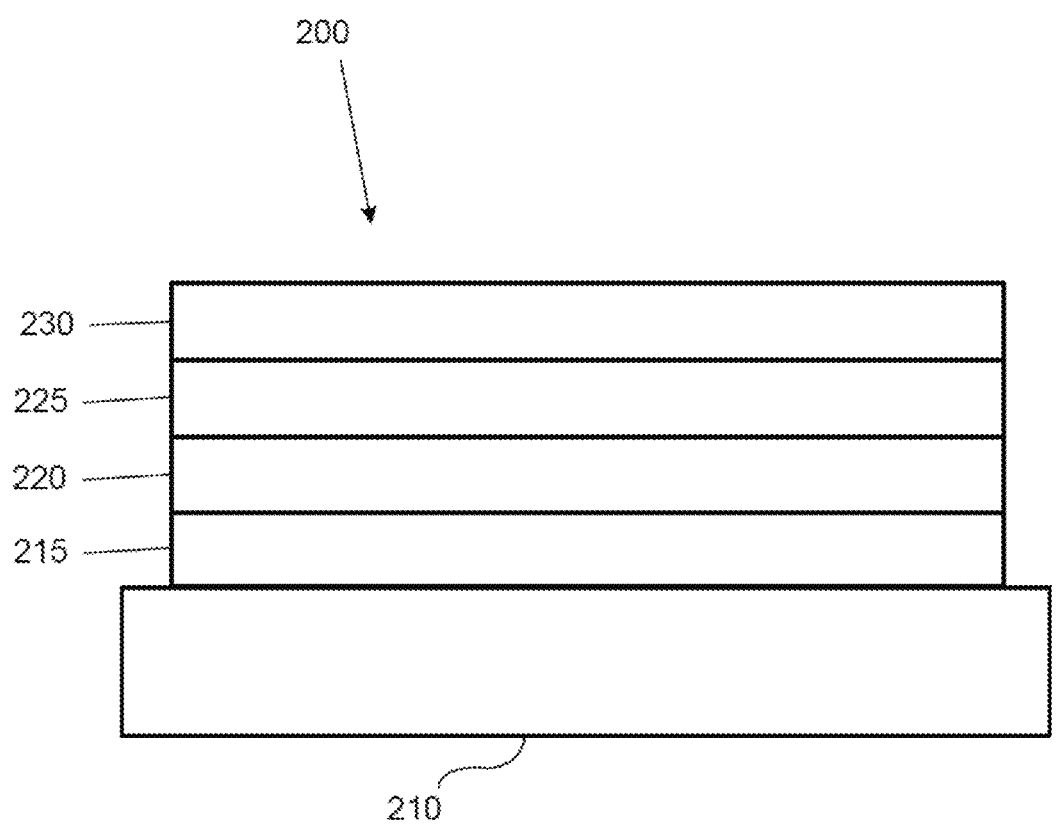
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18° C. to 30° C., and more preferably at room temperature (20°-25° C.), but could be used outside this temperature range, for example, from −40° C. to +80° C.

Embodiments of the disclosed subject matter provide increased directional light concentration from an emissive device such as an organic light-emitting diode (OLED) luminaire, for use in spot lighting and other applications for high intensity illumination.

As disclosed herein, a luminaire device may include a base having an opening, and a plurality of organic light emitting devices (OLEDs) disposed on a plurality of substrates and arranged in a light directing structure onto the base, where the opening of the base is a light exit aperture of light output by the plurality of OLEDs. Each OLED can include a reflective surface that is disposed to direct light output by each OLED towards the light exit aperture, independent of its original emission position within the light directing structure. The reflective surface of opposing sides of the light directing structure may concentrate light emitted into the structure from the OLEDs and directs the light towards the light exit aperture.

Figure 9:
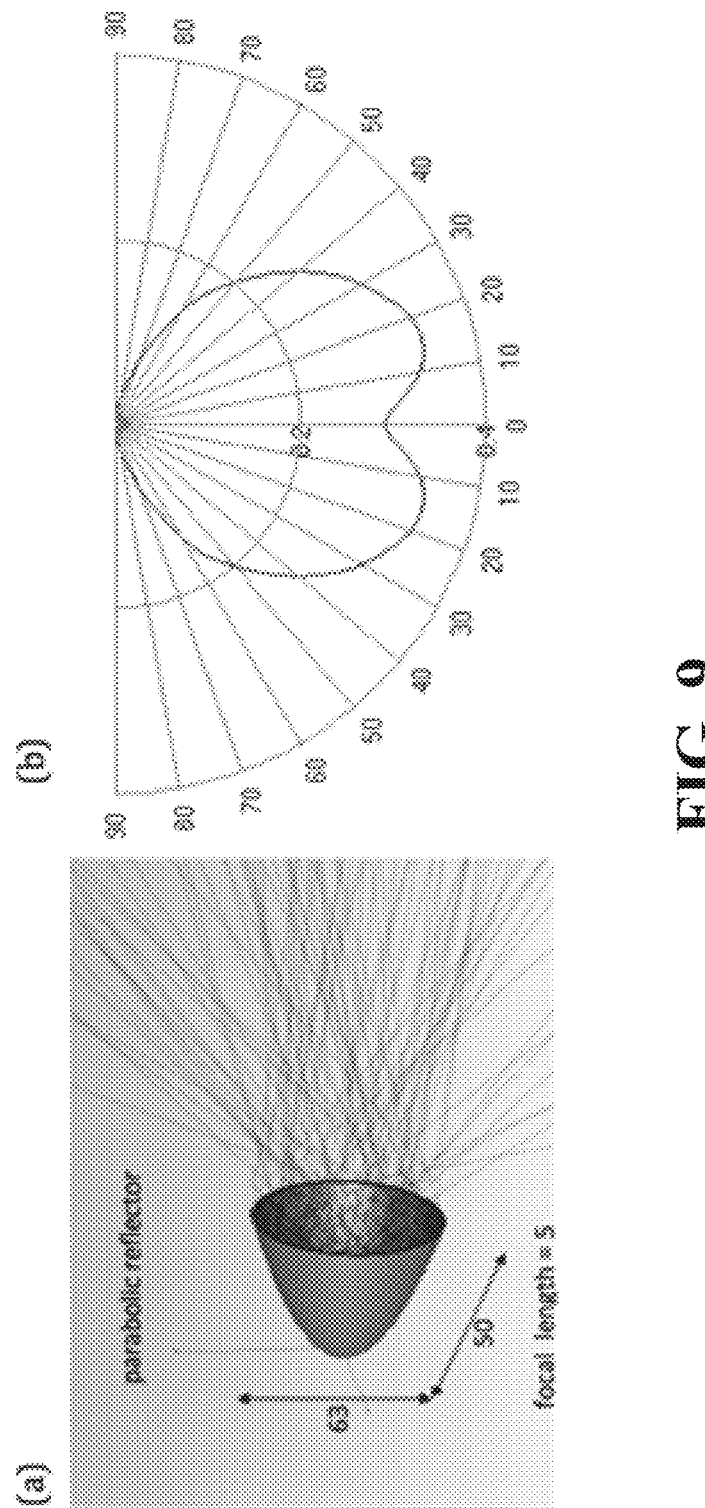
FIGS. 9(a)-9(b) show a parabolic concentrator and its angular distribution profile according to an embodiment of the disclosed subject matter.

The light directing structure may be a polyhedral structure (e.g., discussed below in connection with FIGS. 3(a)-3(d)) or a parabolic structure (e.g., as shown in FIG. 9 and discussed below). As used herein, a polyhedral structure refers to a structure having planes, meeting in pairs along the edges which are straight-line segments, and with the edges meeting in vertex points. The polyhedral structure may be, for example, a triangular structure, a tetragonal structure, a pentagonal structure, a hexagonal structure, a heptagonal structure, an octagonal structure, a nonagonal structure, a decagonal structure, a hendecagonal structure, or a dodecagonal structure. As used herein, the parabolic structure may be a three-dimensional structure having symmetrical curves, which are approximately U-shaped. The parabolic structure may be, for example, a simple paraboloid, a circular paraboloid, an elliptic paraboloid, a hyperbolic paraboloid, or a compound paraboloid.

The device disclosed herein may output red, green, blue, and/or white light, and the device may be controlled so as to adjust the color temperature of the outputted light.

In some embodiments, the concentrating luminaire device can include multiple triangular, large-area OLEDs, such as electrophosphorescent light emitting devices (PHOLEDs) deposited onto plastic substrates and assembled into a structure whose open base serves as the light exit aperture, such as four such devices arranged in a pyramid. In such an embodiment, the pyramidal structure may be the light directing structure. The OLED surfaces may be highly reflective. The emission from the devices may be directed toward the aperture independent of its original emission position within the pyramid. The reflectance inherent to the OLED architecture concentrates light emitted into the structure by the opposing pyramid sides, ultimately directing the emission toward the aperture.

A total emissive area of the OLEDs may larger than that of the light exit aperture so as to increase luminance. Since the emissive area may be larger than that of the aperture, the luminance may be increased by approximately a factor of three compared to a conventional device with the same area as the aperture. Light output from the light exit aperture of the device may be in a pattern that provides uniform surface illuminance. The far-field intensity profile of the concentrator may have a "batwing" distribution that meets requirements and/or desired features of general lighting for uniform illumination of planar surfaces. The directionality of the emission from the OLEDs determines the radiation pattern of the concentrator, and also may affect the degree of concentration. An emission profile of the device may be adjustable according to a profile of the OLEDs. A directionality of light emitted from the OLEDs may determine a radiation pattern and the concentration of the light output.

Figure 3:
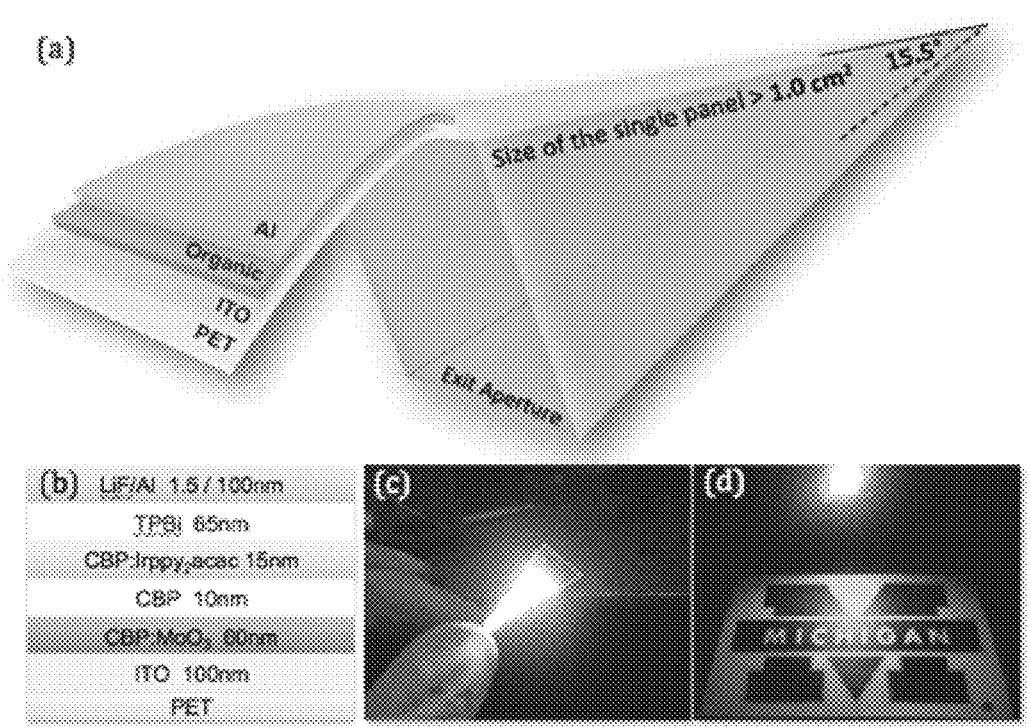
FIGS. 3(a)-3(d) show a concentrator, a phosphorescent organic light emitting device (PHOLED) structure, and emissions from PHOLED structures according to embodiments of the disclosed subject matter.

FIGS. 3(a)-3(d) shows a concentrator that includes four OLEDs according to an embodiment of the disclosed subject matter. Four OLEDs may be grown on triangular substrates, such as indium tin oxide (ITO)-coated polyethylene terephthalate (PET) substrates, and may be attached to metal plates having the same shape and size as the devices. Each section, combining the device and the plate as shown in FIG. 3(c), may be assembled into a pyramidal structure (e.g., a structure having an apex angle of 15.5°, or the like), and fixed in place. The emissive (or substrate) side of the OLED may face inwards so that the light emission from one segment is reflected by adjacent devices, and is directed towards the exit aperture, as shown in FIG. 3(d).

The OLEDs of the device, such as that shown in FIGS. 3(a)-3(d) may be flexible OLEDs, fluorescent OLEDs, or phosphorescent OLEDs. The OLEDs may emit red light, green light, blue light, and/or white light. A controller may control a color temperature of the emitted light from the plurality of OLEDs. In some embodiments, a surface of the plurality of OLEDs is reflective to visible light. OLEDs used with embodiments disclosed herein may be top-emitting and/or bottom-emitting when the individual OLED structure is considered. That is, OLEDs used in embodiments disclosed herein may emit through the substrate on which they are fabricated, or through the opposite surface of the OLED. Thus, each individual OLED may be arranged such that the substrate is on the interior surface of the OLED relative to the concentrator, or on the outermost surface of the OLED relative to the interior of the concentrator, depending upon whether each OLED is top- or bottom-emitting.

In some embodiments, the concentrator can include a microlens array or a grating that is embedded into each of the substrates, so that the light output from a light exit aperture has a directed illumination profile. The light exit aperture of the device including the concentrator may be adjustable, where a larger aperture produces a higher luminous flux at a lower exit angle than that with a smaller aperture, since light emitted by the OLEDs at a vertex of the light directing structure has fewer reflections with the larger aperture.

One or more of the substrates of the concentrator, such as the concentrator shown in FIGS. 3(a)-3(d), may be disposed with respect to one another so as to form apex angles of 15.5°-55.5°. The apex angles decrease the exit angle of light output from the light exit aperture. The apex angles may provide a concentration factor of 3.0 to 1.4 and an extraction efficiency of 40%-70% of the light output by the OLEDs. The apex angles at which the substrates are disposed with respect to one another may be adjustable so as to enable emission from any location from the OLEDs to be directed toward the light exit aperture.

A concentration factor (CF) may be defined as the ratio of the luminous flux of the luminaire measured at the exit aperture to that of the conventional planar device as a reference with the same area as the aperture:

$$CF(J) = \frac{\sum_{i=1}^{4} L_{side,i}(J) \times A_{side}}{L_{ref}(J) \times A_{ref}} \quad (1)$$

Here, $L_{side,i}$ and $L_{ref}$ the luminances from the single panel concentrator device placed within the luminaire, and the reference (e.g., areas $A_{side}$ and $A_{ref}$), respectively, at current density, J. Further, $$L_{eff} = \sum_{i=1}^{4} L_{side,i} \cdot (A_{side}/A_{ref})$$

may be defined as the effective luminance ($L_{eff}$) of the concentrator emitted at the aperture compared with the reference.

Figure 4A:
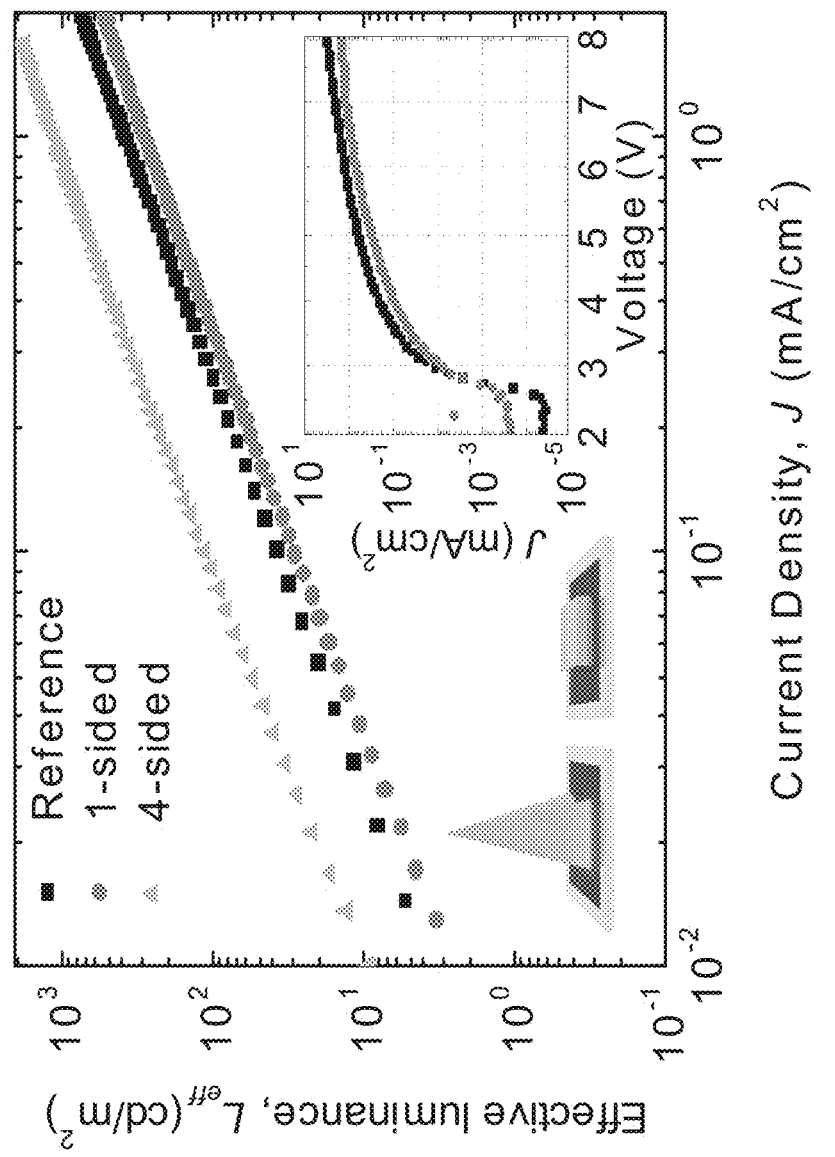
FIG. 4(a) shows the effective luminance versus current density characteristics for various devices forming concentrators according to embodiments of the disclosed subject matter, with an inset showing current density versus voltage (J-V) characteristics of the reference device and a single panel PHOLED.
Figure 4B:
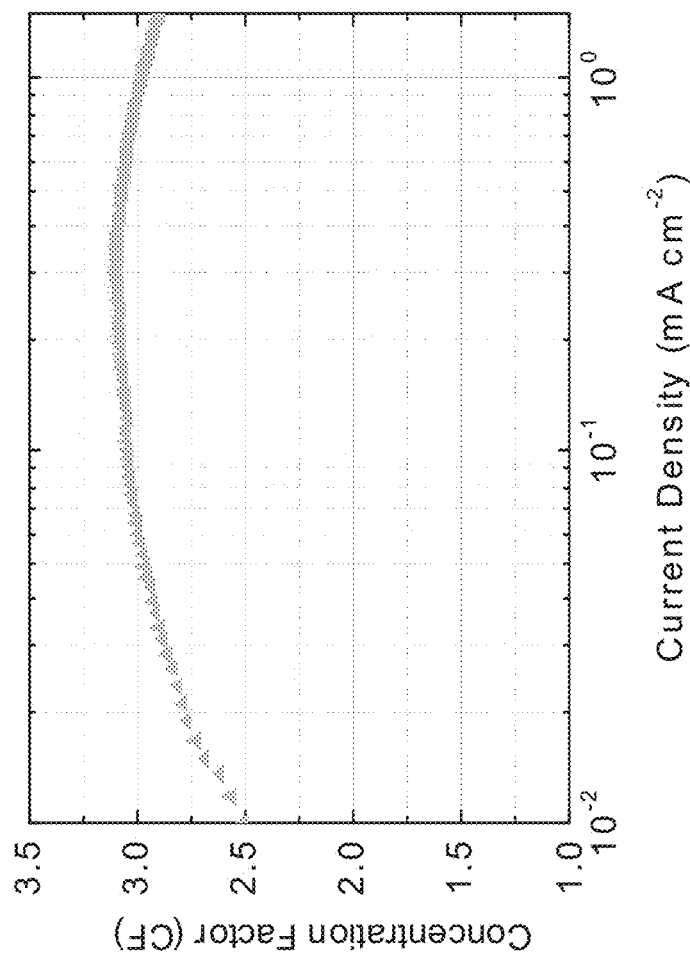
FIG. 4(b) shows a concentration factor (CF) versus a current density (J) of the concentrator according to an embodiment of the disclosed subject matter.

FIG. 4(a) shows the effective luminance ($L_{eff}$) versus current density (J) characteristics of a reference device, a single panel device with the other panels turned off, and from four panels forming an example concentrator. The current density (J) versus voltage (V) characteristics (as shown in the inset portion of FIG. 4(a)) indicate that the panel device operates at a higher voltage than the reference, which is primarily a result of increased lateral resistance of ITO (indium tin oxide) with a device area. Although the single panel device has a lower $L_{eff}$ than the reference device, likely due to losses from reflections inside the concentrator, the integrated $L_{eff}$ from the concentrator substantially exceeds that from the reference device. As a result, the CF for the device is in the range of 2.5 to 3.1, at current densities from 0.01 to 1 mA/cm², as shown in FIG. 4(b). Given that the area ratio is 7.4, the loss in the concentrator is approximately 60%, yet this is partially compensated by the higher brightness at the aperture.

To demonstrate the effect of geometry on CF, equation (1) may be rewritten as:

$$CF(J) = 4 \cdot G(\theta_{apex}) \cdot \eta_{ext}(J, G(\theta_{apex})) \quad (2)$$

where $G(\theta_{apex}) = \frac{1}{4} \cdot \csc(\theta_{apex}/2)$ is the geometric area ratio between the single concentrator panel and the aperture as a function of apex angle, $\theta_{apex}$. Also, $\eta_{ext}(J, G(\theta_{apex}))$ is the geometric extraction efficiency measured by comparing the luminance of the single panel concentrator device versus the reference at J.

The geometric extraction efficiency ($\eta_{ext}(J, G(\theta_{apex}))$) may be determined by:

$$\eta_{ext}(J, G(\theta_{apex})) = \int_S I(s) \cdot R(\theta_{apex})^{N_{ds}} \cdot ds \bigg/ \int_S I(s) \cdot ds, \quad (3)$$

where G is the geometric area ratio, J is the current density, $\eta_{ext}$ is the extraction efficiency, $\theta_{apex}$ is an apex angle, I(s) is the initial luminance emitted by an area segment, ds, of the single panel device with a total area of S (that is, S is the total area of the single device including the concentrator), $R(\theta_{apex})$ is the reflectance of the OLED, and $N_{ds}$ is the number of reflections for a ray from ds to reach the aperture as discussed below.

Figure 5:
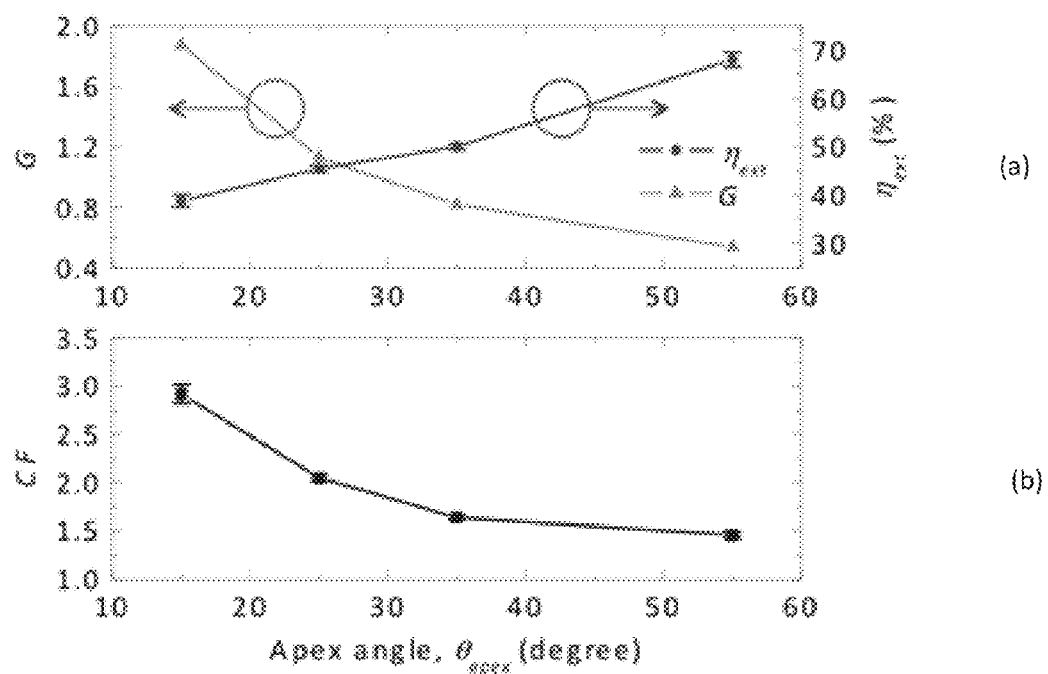
FIG. 5(a) shows a geometric areal ratio (G) and an extraction efficiency ($\eta_{ext}$) of the concentrator according to an embodiment of the disclosed subject matter.
FIG. 5(b) shows a concentration factor (CF) versus an apex angle according to an embodiment of the disclosed subject matter.

FIGS. 5(a)-5(b) show G, $\eta_{ext}$ and CF at J=1.0 mA/cm⁻² as functions of four different $\theta_{apex}$ and a fixed aperture area of 1.0 cm². In particular, FIG. 5(a) shows a geometric area ratio (G) and an extraction efficiency ($\eta_{ext}$), and FIG. 5(b) shows the CF versus the apex angle, $\theta_{apex}$, at J=1.0 mA/cm² for concentrators with $\theta_{apex}$ of 15.5, 25.5, 35.5 and 55.5°. The CF may increase monotonically as $\theta_{apex}$ decreases due to the increased number of reflections compared to concentrators with large $\theta_{apex}$. At the same time, $\eta_{ext}$ may be decreased due to increased propagation losses. As $\theta_{apex}$ is decreased from 55.5° to 15.5°, $\eta_{ext}$ may decrease from 68.1±1.5% to 38.9±1.3% due to the increased number of reflections. That is, utilization of the effective area that contributes to the output luminance may decrease with $\theta_{apex}$. Nonetheless, CF increases from 1.46±0.03 to 2.92±0.10 due to the increase of G. Table 1 gives values for CF and $\eta_{ext}$, at J=1.0 mA cm⁻² for these devices.

and/or avoid strong veiling reflections from the illuminated surface that results from intense downward emission at low $\phi$.

A ray-tracing algorithm may be used to model the angular distribution profile of the luminaire, and to determine Nds in Eq. (3). The simulation generates the extraction efficiency, $\eta_{ext}$, of the rays emitted at distance, x, from the vertex of the concentrator, the intensity-weighted average number of reflections, $\overline{N}$, required to reach the aperture, and their intensity-weighted-average exit angles, $\overline{\alpha}_{exit}$, relative to the concentrator central axis. Each property for two different OLED reflectances, $R_{OLED}$, is provided in Table 2. Details of the algorithm and assumptions used are described below in connection with FIG. 12.

TABLE 2

Simulated extraction efficiency, average intensity-weighted reflections and exit angles ($\eta_{ext,x}$, $\overline{N}_{reflection}$, $\overline{\alpha}_{exit}$ respectively) of the exiting rays for two values of OLED reflectance, $R_{OLED}$, versus the relative position of emission, x, from the apex. Concentrator height is assumed to be unity, and the device reflectance invariant to incident angle.

| Position x | $R_{OLED}$ (%) | 0 | 0.1 | 0.2 | ... | 0.8 | 0.9 | 1.0 |
|---|---|---|---|---|---|---|---|---|
| $\eta_{ext,x}$ | 66 | 14.2% | 15.7% | 17.7% | ... | 43.0% | 53.8% | 69.3% |
| | 71 | 18.7% | 20.3% | 22.5% | ... | 47.6% | 57.4% | 71.1% |
| $\overline{N}_{reflection}$ | 66 | 3.63 | 3.44 | 3.20 | ... | 1.33 | 0.84 | 0.31 |
| | 71 | 3.92 | 3.71 | 3.44 | ... | 1.45 | 0.94 | 0.37 |
| $\overline{\alpha}_{exit}$ | 66 | 1.2° | 0.6° | 0.5° | ... | 29.4° | 39.1° | 51.2° |
| | 71 | 1.1° | 0.6° | 0.5° | ... | 29.7° | 39.3° | 51.0° |

TABLE 1

Concentration factor (CF) and extraction efficiency ($\eta_{ext}$) at a current density (J) of 1.0 mA cm⁻² versus the apex angle, $\theta_{apex}$.

| $\theta_{apex}$ | 15.5° | 25.5° | 35.5° | 45.5° |
|---|---|---|---|---|
| CF | 2.9 ± 0.1 | 2.05 ± 0.03 | 1.64 ± 0.02 | 1.46 ± 0.03 |
| $\eta_{ext}$ (%) | 38.9 ± 1.3 | 45.5 ± 0.7 | 50.1 + 0.6 | 68.1 ± 1.5 |

In Table 1, the concentration CF is calculated based on the effective luminance from a single panel, and assuming that all four panels have identical luminous characteristics. Errors for CF and $\eta_{ext}$ may be standard deviations from at least three single panel concentrator devices.

Figure 6:
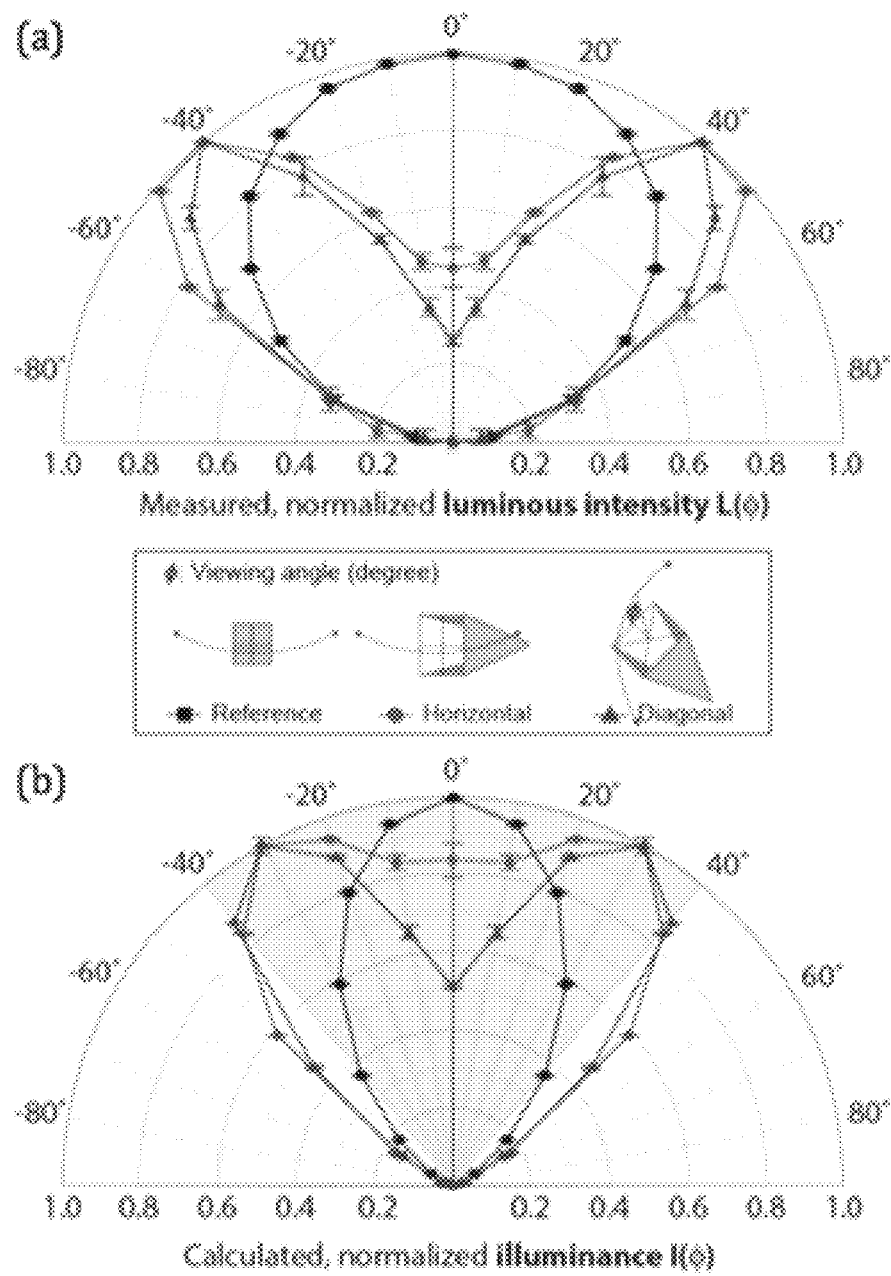
FIG. 6(a) shows a normalized luminous intensity according to an embodiment of the disclosed subject matter.
FIG. 6(b) shows a calculated illuminance of a concentrator with respect to the reference in the polar coordinate versus a viewing angle according to an embodiment of the disclosed subject matter.

FIG. 6(a) shows the normalized luminous intensity of the concentrator with respect to the reference as a function of viewing angle, $\phi$, measured in the direction parallel to the side (denoted as horizontal) and along the diagonal of the aperture. While the reference device is approximately a Lambertian source, the concentrator according to embodiments of the disclosed subject matter may exhibit a batwing intensity profile where the intensity at viewing angles from $\phi$=40° to 50° relative to the aperture normal is larger than along the central axis of the concentrator. The resultant illuminance distribution is given by:

$$I(\phi) = \frac{L(\phi)}{h^2} \cdot \cos^3\phi \quad (4)$$

at a viewing angle $\phi$ and distance, h. For arbitrary h, the concentrator may produce a nearly uniform surface illumination over $\Delta\phi$=±40°, while the reference device may have peak illuminance at $\phi$=0° and decreases dramatically with $\phi$, as shown in FIG. 6(b). When installed overhead, the profile of the concentrator, unlike the reference device, may reduce Table 2 shows simulated (e.g., where concentrator height is assumed to be unity, and the device reflectance invariant to incident angle) extraction efficiency ($\eta_{ext}$), average intensity-weighted reflections ($\overline{N}$), and exit angles ($\overline{\alpha}_{exit}$) of the exiting rays for two values of OLED reflectance, $R_{OLED}$, versus the relative position of emission, x, from the apex.

Emission originating near the apex may be strongly attenuated due to the high $N_{ds}$, and hence may not contribute significantly to the exit luminance. In addition, $\overline{\alpha}_{exit}$ of such rays are low, which is responsible for the relatively weak intensity along the central axis (e.g., as shown in FIGS. 6(a)-6(b)). On the other hand, rays emitted near the aperture escape with fewer reflections, and $\overline{a}_{exit}$ is distributed across a range from only 30° to 50°, corresponding to the high intensity peak near 40° observed in the profile (e.g., as shown in the shaded area of FIG. 6(b)). A primary factor that determines $\overline{\alpha}_{exit}$, and the resultant batwing distribution, is the Lambertian emission distribution of the panels. The reflectance of the device may determine $\eta_{ext}$ (see Table 2). The desired emission profile of the concentrator may be achieved by tailoring the profiles of its component OLEDs. For example, if the OLEDs in the concentrator have relatively intense emission at high angles by using, for example, microlens arrays or a grating embedded in the substrate, the emission can be extracted with a lower $\overline{N}$ at smaller $\overline{\alpha}_{exit}$, which results in directed or spot illumination profiles.

Figure 13:
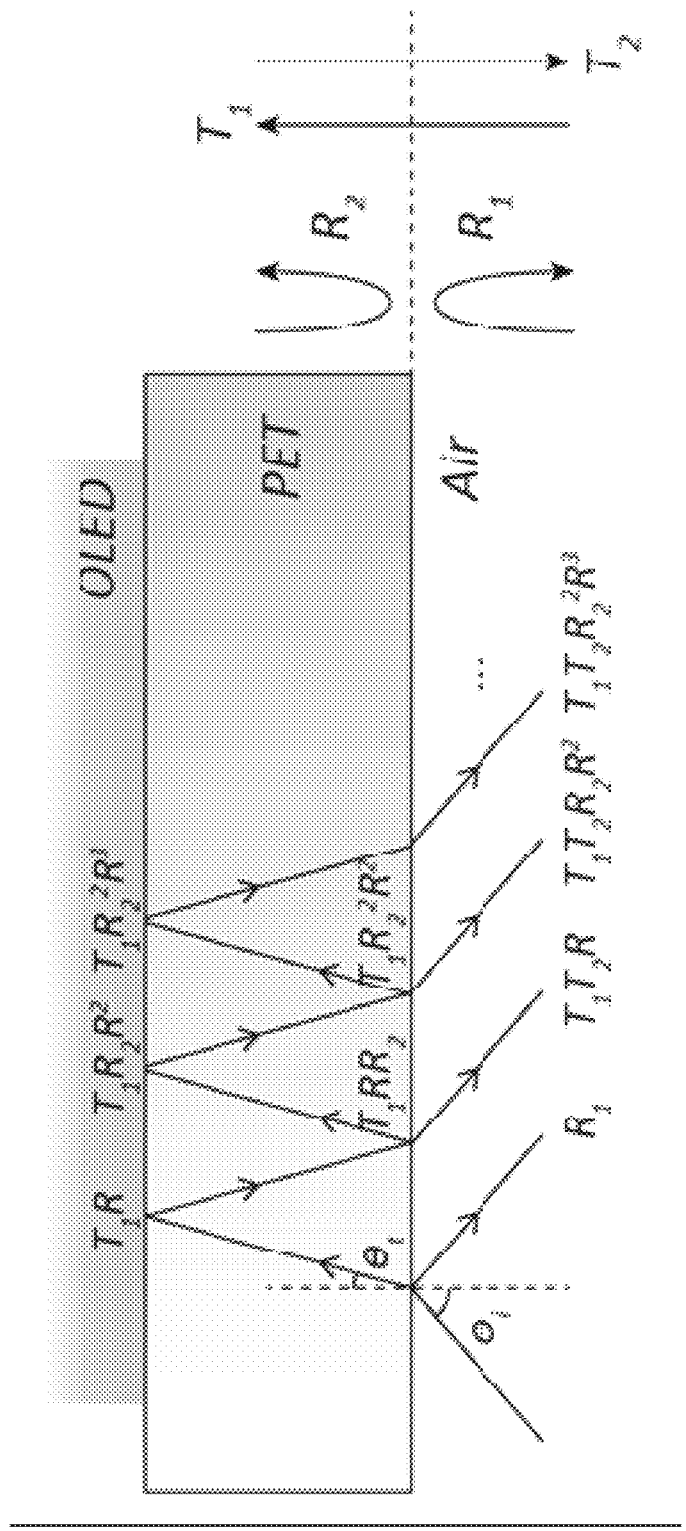
FIG. 13 shows PHOLED reflectance and transmittance according to embodiments of the disclosed subject matter.

The geometry of the concentrator also affects its emission profile. A concentrator with a larger aperture (or $\theta_{apex}$) may produce a higher luminous flux at low $\overline{\alpha}_{exit}$ than that with a smaller aperture, since the rays emitted near the vertex experience fewer reflections with an enlarged escape cone, as shown in FIG. 13 and disclosed below. Additionally, if the side panel angle is large, its emission near the aperture exits at smaller $\overline{\alpha}_{exit}$, while increasing the total $\eta_{ext}$ as shown in Table 3 below. This configuration has a correspondingly decreased geometric area ratio, leading to a reduced CF (see FIGS. 5(a)-5(b)).

TABLE 3

Simulated $\eta_{ext}$, $\overline{N}_{reflection}$, $\overline{\alpha}_{exit}$ of the exiting rays for two values of apex angle, $\theta_{apex}$, vs. x from the apex. Concentrator height is assumed to be unity, and the $R_{OLED}$ is set to be 66%.

| Position x | $\theta_{apex}$ | 0 | 0.1 | 0.2 | ... | 0.8 | 0.9 | 1.0 |
|---|---|---|---|---|---|---|---|---|
| $\eta_{ext,x}$ | 25.5° | 25.2% | 27.2% | 29.6% | ... | 58.4% | 66.3% | 75.2% |
|  | 55.5° | 42.7% | 44.0% | 45.5% | ... | 74.6% | 78.4% | 80.3% |
| $\overline{N}_{reflection}$ | 25.5° | 2.76 | 2.56 | 2.34 | ... | 0.83 | 0.54 | 0.27 |
|  | 55.5° | 1.72 | 1.63 | 1.53 | ... | 0.35 | 0.26 | 0.22 |
| $\overline{\alpha}_{exit}$ | 25.5° | 8.0° | 8.1° | 7.9° | ... | 20.4° | 29.1° | 37.9° |
|  | 55.5° | 40.0° | 39.6° | 39.0° | ... | 7.5° | 4.0° | 1.1° |

Figure 7:
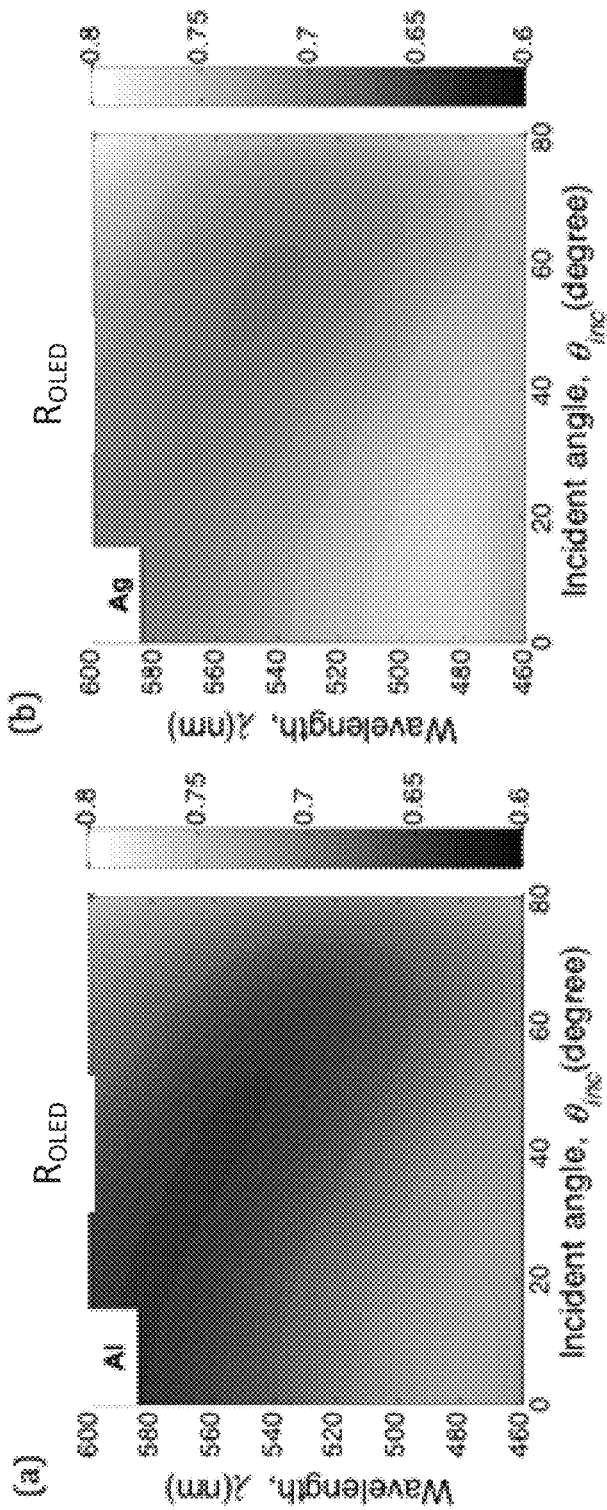
FIG. 7(a) shows an average of a transverse electric and magnetic mode reflectances of a PHOLED having a 65 nm-thick hole blocking and electron transport layer with an Al cathode according to an embodiment of the disclosed subject matter.
FIG. 7(b) shows an average of a transverse electric and magnetic mode reflectances of a PHOLED having a 65 nm-thick hole blocking and electron transport layer with an Ag cathode according to an embodiment of the disclosed subject matter.
Figure 8:
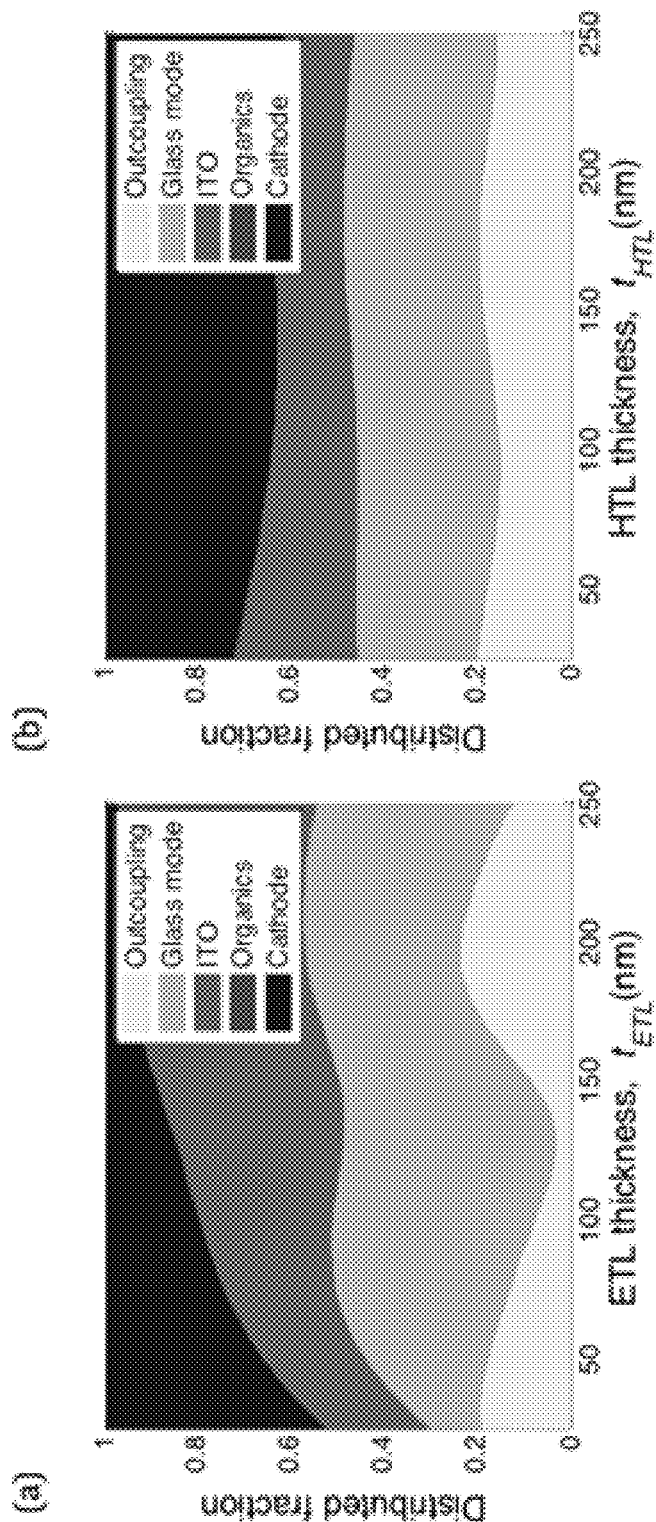
FIG. 8(a) shows a thickness variation for an electron transport layer (ETL) according to an embodiment of the disclosed subject matter.
FIG. 8(b) shows a thickness variation for a hole transport layer (HTL) according to an embodiment of the disclosed subject matter.

Both $\eta_{ext}$ and CF may be enhanced, independent of geometry, by increasing the OLED reflectance, $R_{OLED}$. The OLED may form a weak microcavity, where $R_{OLED}$ is determined by the reflection, transmission and interference occurring inside the organic thin films and the metal cathode. FIGS. 7(a)-7(b) show $R_{OLED}$ as a function of incident angle, $\theta_{inc}$ and wavelength, $\lambda$, calculated for OLEDs having an electron transport layer with an Al cathode (denoted as Device A) or with an Ag cathode (Device B), as shown in FIGS. 8(a)-8(b), and disclosed below. Since the OLED emission may be unpolarized, its total reflectance is obtained from the average of the transverse electric and magnetic mode reflectances at wavelengths from $\lambda$=460 to 600 nm, corresponding to 90% of the spectral emission from the green OLED, and at incident angles from $\theta_{inc}$=0° to 80°. At $\theta_{inc}$>80°, most emission for both devices is reflected by the PET substrate. The reflectance of Device A may vary from 64.2±1.3% to 76.3±1.2%, compared with that of the Device B, which may vary from 69.2±0.6% to 79.9±2.2%. The errors may be due to the 10% variation of the total thickness of the organic layers. Since Ag has a smaller extinction coefficient than Al, Device B may be correspondingly less absorbing and may have a higher $R_{PHOLED}$, as shown in FIGS. 7(a)-7(b), leading to an increased $\eta_{ext}$ from the concentrator (Table 2). The high $R_{OLED}$ contours in FIGS. 7(a)-7(b) may be spectrally shifted to the OLED emission maximum by tuning the thickness of the electron transport layer (ETL) and/or the hole transport layer (HTL).

The outcoupling efficiency of the OLEDs, which may contribute to the total luminous flux of the concentrator, is also dependent on the properties of the microcavity formed between the emission zone and the cathode as shown in FIGS. 8(a)-8(b).

FIGS. 8(a)-8(b) shows calculated outcoupling efficiency of the OLEDs at wavelength ($\lambda$) of 522 nm at an emission angle $\theta$=0°, normal to the layers. The thickness are varied for the (a) ETL, (b) HTL. The device structure used in the calculation is: ITO (100 nm)/15 wt % MoO$_3$ doped into CBP ($t_{HTL}$ nm)/CBP (10 nm)/Ir(ppy)2(acac) doped into CBP (15 nm)/TPBi (10 nm)/2 wt % Li doped into Bphen ($t_{ETL}$ nm)/LiQ (1.5 nm)/Ag (150 nm). The refractive indices of the organic layers are measured by variable angle spectroscopic ellipsometer. Each fraction coupled to air modes (outcoupling), glass modes, waveguide modes (ITO and organics) and the cathode is calculated from the relative energy transferred from the dipoles. The dipole may be formed at the interface between the emissive layer (EML) and hole blocking layer (HBL).

As demonstrated by this example, $R_{OLED}$ may be modified by varying the HTL thickness without significantly changing the outcoupling efficiency of the device. The fraction of incident light that is not reflected may be primarily absorbed by the ITO and the cathode. For example, Device A may have the following characteristics: ITO 100 nm/15 wt % MoO$_3$ doped into CBP 60 nm/CBP 10 nm/8 wt % doped in Ir(ppy)$_2$(acac) into CBP 15 nm/TPBi 65 nm/LiF 1.5 nm/Al 150 nm. Device B may have the following characteristics: ITO 100 nm/15 wt % MoO$_3$ doped into CBP 60 nm/CBP 10 nm/8 wt % doped into Ir(ppy)$_2$(acac) in CBP 15 nm/TPBi 10 nm/2 wt % doped Li in Bphen 55 nm/8-hydroxyquinolinato lithium (LiQ) 1.5 nm/Ag 150 nm. At normal incidence at $\lambda$=522 nm where the OLED emission peaks, ITO and Al in Device A absorbs 20.0±1.2% and 10.1±0.8% of the light, while the ITO and Ag absorption in Device B are 19.7±1.7% and 5.1±0.2%, respectively, considering 10% variation in thickness of organic layers.

In the embodiments of the disclosed subject matter disclosed above, concentrated OLED emission may be from a pyramid-shaped luminaire device and/or other polyhedral luminaire device. By increasing the area of a side of the concentrator, a high concentration factor may be achieved at the expense of the geometric extraction efficiency due to increased reflections from the surfaces of the devices comprising the edge of the luminaire. To achieve efficient extraction and high CF, increasing the cathode reflectivity is an effective means to increase the device external luminance efficiency. The angular intensity profile of the luminaire follows a batwing distribution, making it suitable for uniform downward illumination of surfaces. While a pyramid shape is shown and described herein as an example concentrator structure, different concentration factors and emission profiles can be achieved employing other geometries, such as a triangular structure, a tetragonal structure, a pentagonal structure, a hexagonal structure, a heptagonal structure, an octagonal structure, a nonagonal structure, a decagonal structure, a hendecagonal structure, and a dodecagonal structure. The structure may be a parabolic structure, such as a simple paraboloid, a circular paraboloid, an elliptic paraboloid, a hyperbolic paraboloid, and a compound paraboloid.

For example, a parabolic or compound parabolic concentrator can potentially achieve a CF as high as 7, and may provide aesthetic advantages over the pyramidal-shaped design. FIG. 9(a) shows a parabolic concentrator (reflector) whose geometric areal ratio, G, is equal to 2.3. FIG. 9(b) its simulated angular distribution profile as a function of viewing angle in the arbitrary unit.

Figure 10:
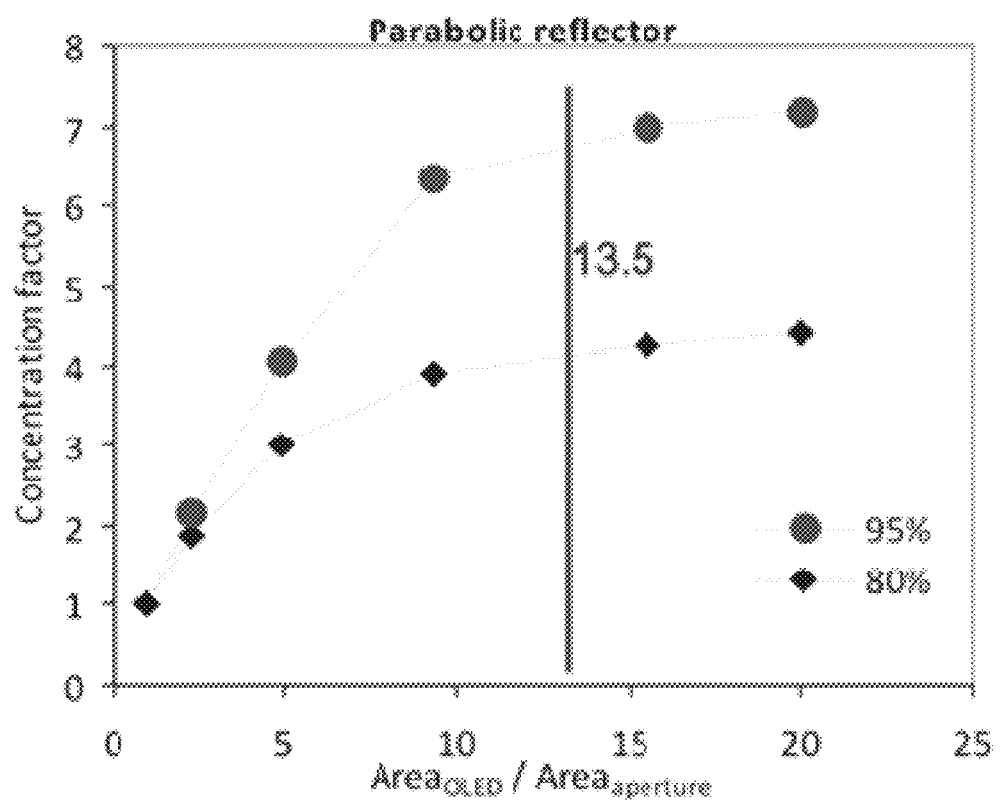
FIG. 10 shows the Concentration Factor (CF) versus geometric areal ratio, G, of the parabolic concentrator for two different PHOLED reflectances according to an embodiment of the disclosed subject matter.

FIG. 10 shows a Concentration Factor (CF) versus geometric areal ratio, G, of the parabolic concentrator (reflector) for two different PHOLED reflectance, $R_{PHOLED}$, 80% and 95% invariant to the incident angle. At G=13.5, and $R_{PHOLED}$=80% and 95%, the parabolic concentrator attains CF=4.0 and 6.8, respectively.

That is, concentrating the emission as disclosed herein can be advantageously realized in many practical, high intensity OLED-based luminaire configurations.

As disclosed above, a luminaire device may include a base having an opening, and a plurality of organic light emitting devices (OLEDs) disposed on a plurality of substrates and arranged in a light directing structure onto the base, where the opening of the base is a light exit aperture of light output by the plurality of OLEDs. Each OLED can include a reflective surface that is disposed to direct light output by each OLED towards the light exit aperture, independent of its original emission position within the light directing structure. The reflective surface of opposing sides of the light directing structure may concentrate light emitted into the structure from the OLEDs and directs the light towards the light exit aperture.

EXPERIMENTAL

Four PHOLEDs grown on triangular, ITO-coated substrates were attached to metal plates having the same shape and size as the devices, as shown in FIG. 3(a). Each section, combining the device and the plate is then assembled into a pyramidal structure with an apex angle of 15.5°, and fixed in place. The emissive (or substrate) side of the PHOLED faces inwards so that the light emission from one segment is reflected by adjacent devices, and is eventually directed towards the exit aperture.

In some embodiments, the PHOLEDs of FIGS. 3(a)-3(b) may be grown by vacuum sublimation at a base pressure less than $5\times10^{-7}$ torr on the 60Ω/□ (i.e., 60 ohm-per-square) ITO-coated substrates with greater than 79% transmittance at a wavelength (λ) of 550 μm. The device structure is as follows: ITO (100 nm/$MoO^3$ doped at 15 vol. % in 4,4'-bis (carbazol-9-yl)biphenyl (CBP) as a hole injection layer 8 (HIL, 60 nm)/CBP as the hole transport layer (HTL, 10 nm)/bis(2-phenylpyridine) (acetylacetonate) iridium(III) (Ir(ppy)$_2$(acac)) doped at 8 vol. % in CBP as the emissive layer (EML, 15 nm)/2,2',2''-(1,3,5-benzenetriyl)-tris(J-phenyl-1-H-benzimidazole) (TPBi) as the hole blocking and electron transporting layer (HBL and ETL, 65 nm)/LiF (1.5 nm)/Al (cathode, 100 nm). The area of the reference PHOLED and one triangular side of the concentrator were 1 cm$^2$ and 1.85 cm$^2$ (resulting in a total concentrator interior area of 7.4 cm$^2$), respectively. Prior to deposition, particulates remaining on the solvent-cleaned substrates were removed by CO$^2$ snow cleaning to minimize electrical shorts. PHOLED electroluminescence characteristics were measured by a parameter analyzer and a calibrated Si-photodiode whose area is larger than that of the concentrator aperture.

Figures 11A, 11B:
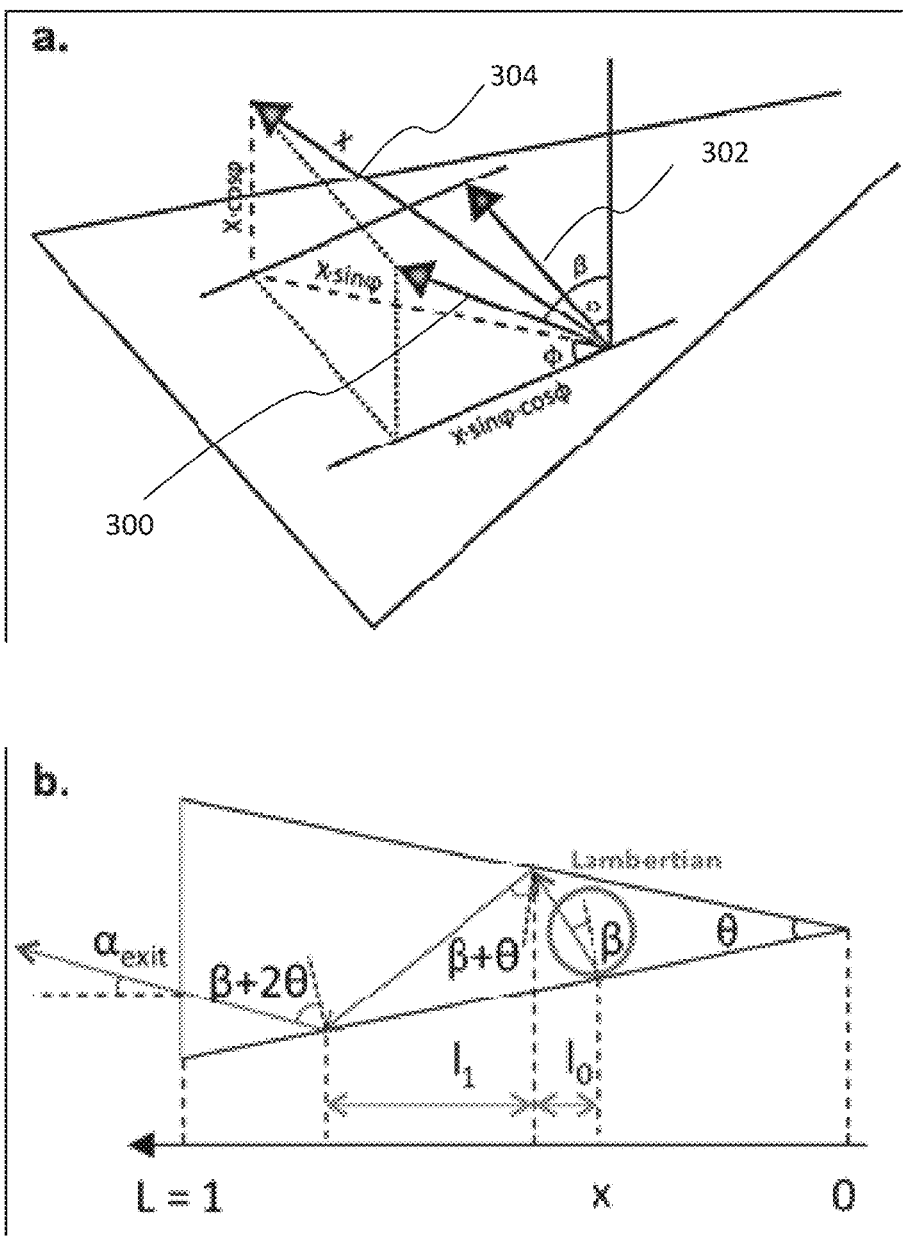
FIGS. 11(a)-11(c) show ray-tracing for a single panel concentrator device according to an embodiment of the disclosed subject matter.
Figure 11C:
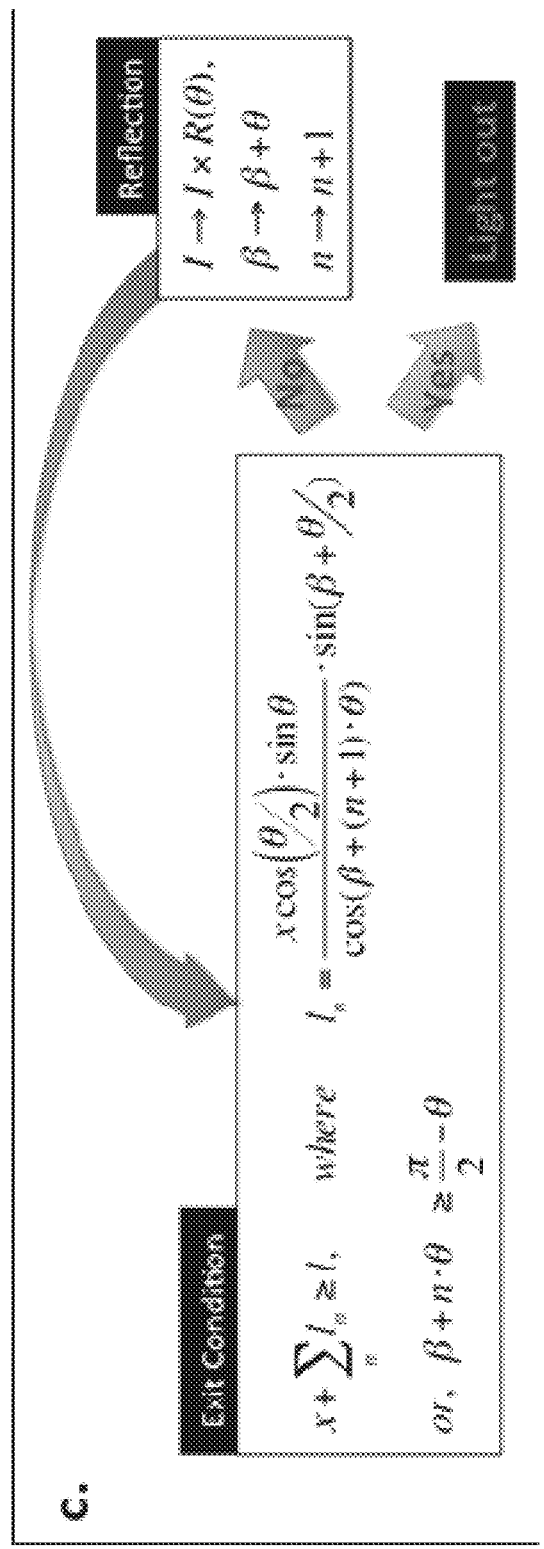

FIGS. 11(a)-11(c) show a ray-tracing algorithm for a single panel concentrator device according to embodiments of the disclosed subject matter. FIG. 11(a) shows decomposition of a ray with initial intensity, I, at the polar angle, φ, and the azimuthal angle, φ, with respect to the normal and the median of the triangular panel, respectively. The forward component is directed toward the aperture (arrow 300), and the lateral component is confined within the pyramid (arrow 302), being reflected (arrow 304) by adjacent device panels and attenuated. Here, φ and φ are varied from −90 to 90° and 0 to 180°, respectively.

FIG. 11(b) shows ray tracing of the forward component at an initial emission angle, β, with respect to the normal of the concentrator panel. The original intensity I of the ray emitted at an arbitrary position x from the vertex of the concentrator satisfies the Lambertian distribution, and its forward component intensity (see FIG. 6(a)-(c) as described above) and β are determined versus φ and φ. As the ray is reflected by the opposing panel, its intensity is attenuated by R$_{PHOLED}$, and its reflected angle is increased by the apex angle, θ, of the concentrator. Then, the ray travels the length, $l_n$ until the next reflection. The height of the concentrator, L, may be set to unity. The exit angle, α$_{exit}$, of the ray escaping through the aperture is defined with respect to the central axis of the concentrator, which determines the final angular distribution profile.

FIG. 11(c) shows a schematic of the ray-tracing algorithm. The ray can escape through the aperture only if it fulfills the exit condition: the total travel lengths added to the initial emission position x must be greater than L, or the initial or reflected emission angle is larger than π/2−θ so that it does not meet the opposing panel. Each traced ray contains information about its final intensity, exit angle, and the number of reflections up to extraction.

The simulation described above may be based on a single-wavelength and fixed reflectance R$_{PHOLED}$ that is independent of the incident angle, and does not include optical effects other than reflection.

Figure 12:
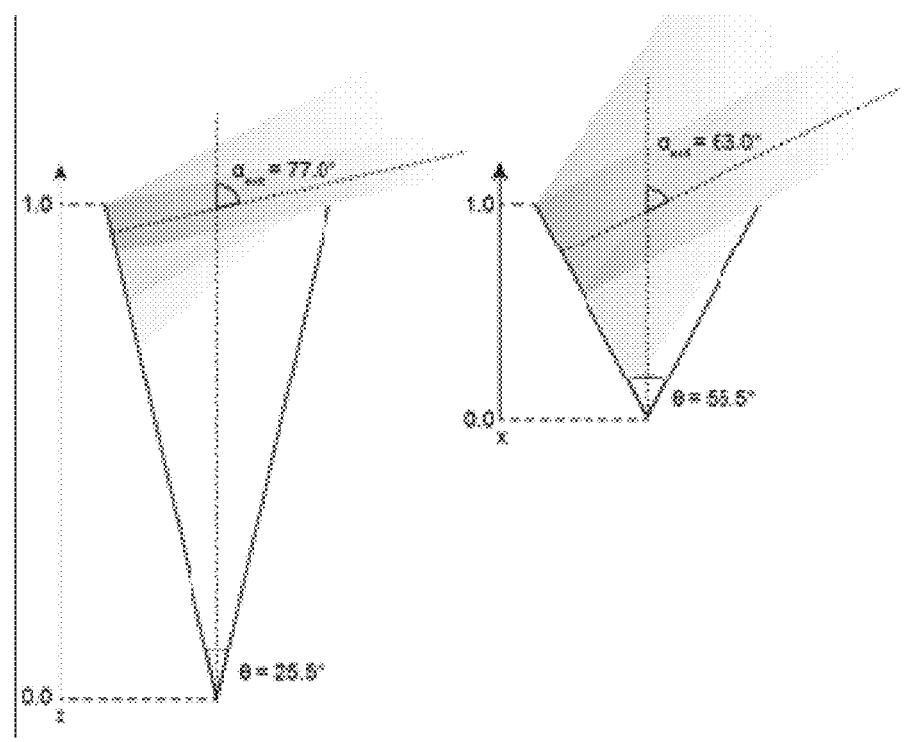
FIG. 12 shows ray-tracing simulation results for different concentrator geometries according to embodiments of the disclosed subject matter.

In embodiments of the disclosed subject matter, there may be different ray-tracing simulation results for different concentrator geometries. FIG. 12 shows a comparison of the exit angles, α$_{exit}$, of emission normal to a single concentrator panel at apex angles, θ$_{apex}$=25.5 and 55.5°. Table 2 above shows the simulated properties of the concentrators with apex angle θ$_{apex}$=25.5 and 55.5°. Concentrators with larger apex angles have improved extraction efficiencies due to the reduced number of reflections relative to those with smaller θ$_{apex}$. Particularly, emission near the vertex is preferentially extracted at larger exit angles ($\overline{\alpha_{exit}}$=39.0°), and the emission near the aperture (x=1) at smaller angles $\overline{\alpha_{exit}}$=1.10. This loss/emission position tradeoff may significantly affect the emission pattern of the concentrator.

The PHOLED reflectance may be calculated. FIG. 13 shows PHOLED reflectance and transmittance with an incident angle θ$_i$ and a refracted angle θ$_t$. The total reflectance of the PHOLED including the PET substrate may be calculated as follows:

$$R_{PHOLED}(\theta_i) = R_1(\theta_i) + T_1(\theta_i) \cdot T_2(\theta_t) \cdot R(\theta_t) + T_1(\theta_i) \cdot T_2(\theta_t) \cdot R_2(\theta_t) \cdot R^2(\theta_t) + \quad (S1)$$

where R$_1$ and R$_2$ are the fractions of the incident energy reflected back to the air and the PET by the air/PET interface, T$_1$ and T$_2$ are the transmitted fractions into the PET and air, respectively, and R is the reflectance of the PHOLED structure calculated using the transfer matrix method. Now, Eq. (S1) is rewritten as:

$$R_{PHOLED}(\theta_i) = R_1(\theta_i) + \frac{T_1(\theta_i) \cdot T_2(\theta_t) \cdot R(\theta_t)}{1 - R(\theta_t) \cdot R_2(\theta_t)} \quad (S2)$$

The transverse electric (TE) and transverse magnetic (TM) mode reflectances are calculated separately according to Eq. (S2) and averaged with the assumption that the incident PHOLED emission is unpolarized.

Referring again to FIG. 8(a)-8(b), the outcoupling efficiency may be calculated with varying the thicknesses of the hole transport (t$_{HTL}$) and electron transport (t$_{ETL}$) layers. FIGS. 8(a)-8(b) show the calculated outcoupling efficiency of the PHOLEDs at wavelength (λ) of 522 nm at an emission angle θ=0°, normal to the layers. The thickness are varied for the ETL shown in FIG. 8(a) and the HTL shown in FIG. 8(b). The device structure used in the calculation is: ITO (100 nm)/15 wt % MoO$_3$ doped into CBP (t$_{HTL}$ nm)/CBP (10 nm)/Ir(ppy)$_2$(acac) doped into CBP (15 nm)/TPBi (10 nm)/2 wt % Li doped into Bphen (t$_{ETL}$ nm)/LiQ (1.5 nm)/Ag (150 nm). The refractive indices of the organic layers are measured by variable angle spectroscopic ellipsometer. Each fraction coupled to air modes (outcoupling), glass modes, waveguide modes (ITO and organics) and the cathode is calculated from the relative energy transferred from the dipoles. It is assumed that the dipole is formed at the interface between EML and HBL.

Figure 14:
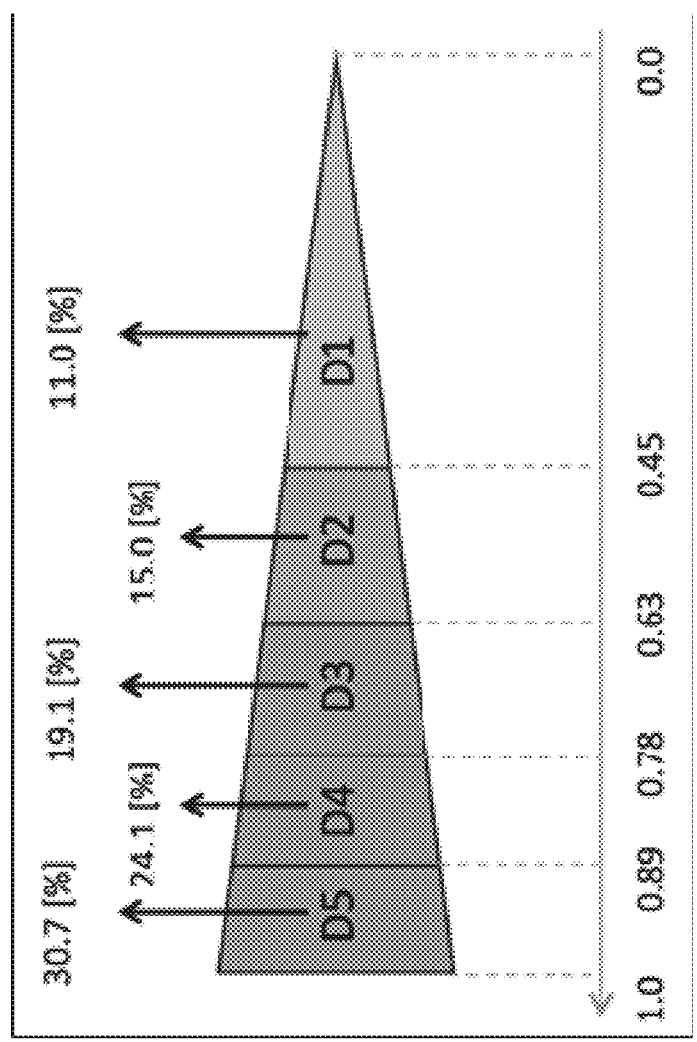
FIG. 14 shows calculated fractions of an extracted emission from equally-sized segments of a single panel device according to embodiments of the disclosed subject matter.

FIG. 14 shows the scale-independency of the concentrator. The fraction of the extracted emission from the equally-sized segments of the single panel device, comprising the total extracted emission at the aperture, may be calculated. The segment closest to the vertex of the concentrator contributes least to the total emission due to the reflections, while the segment closest to the aperture does most. Thus, a pyramid structure may be truncated at certain height, and its top side may be replaced with the planar device, considering the relatively weak contribution of D1 as identified in FIG. 14. However, such height may never exist, because the removed small pyramid is also the concentrator. It can attain the higher luminous flux than the planar device mounted on the top of a truncated pyramid. Therefore, regardless of the dimension of the concentrator and the origin of the emission, all rays generated within the structure may contribute to the light output.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:
   a base having an opening; and
   a plurality of organic light emitting devices (OLEDs) disposed on a plurality of substrates and arranged in a light directing structure onto the base,
   wherein the opening of the base is a light exit aperture of light output by the plurality of OLEDs, and
   wherein at least one of the group consisting of microlens arrays and a grating is embedded into each of the plurality of substrates, so that the light output from the light exit aperture has a directed illumination profile.

2. The device of claim 1, wherein each OLED of the plurality of OLEDs comprises:
   a reflective surface disposed to direct light output by each OLED towards the light exit aperture independent of its original emission position within the light directing structure.

3. The device of claim 2, wherein the reflective surface of opposing sides of the light directing structure concentrates light emitted into the structure from the OLEDs and directs the light towards the light exit aperture.

4. The device of claim 1, wherein the plurality of OLEDs comprise:
   four triangular OLEDs disposed on respective substrates and arranged on the base such that the light directing structure is a pyramidal structure.

5. The device of claim 1, wherein a total emissive area of the OLEDs is larger than that of the light exit aperture so as to increase luminance.

6. The device of claim 1, wherein a directionality of light emitted from the OLEDs determines a radiation pattern and the concentration of the light output.

7. The device of claim 1, wherein an emission profile of the device is adjustable according to a profile of the OLEDs.

8. The device of claim 1, wherein the light exit aperture is adjustable, wherein a larger aperture produces a higher luminous flux at a lower exit angle than that with a smaller aperture, since light emitted by the OLEDs at a vertex of the light directing structure has fewer reflections with the larger aperture.

9. The device of claim 1, wherein one or more of the plurality of substrates of the light directing structure are disposed with respect to one another so as to form apex angles of 15.5°-55.5°.

10. The device of claim 9, wherein the apex angles decrease the exit angle of light output from the light exit aperture.

11. The device of claim 9, wherein the apex angles provide a concentration factor of 3.0 to 1.4 and an extraction efficiency of 40%-70% of the light output by the plurality of OLEDs.

12. The device of claim 1, wherein apex angles at which the substrates are disposed with respect to one another are adjustable so as to enable emission from any location from the OLEDs to be directed toward the light exit aperture.

13. The device of claim 1, wherein the plurality of OLEDs are selected from the group consisting of: flexible OLEDs, fluorescent OLEDs, or phosphorescent OLEDs.

14. The device of claim 1, wherein the plurality of OLEDs emit light having colors selected from the group consisting of: red light, green light, blue light, and white light.

15. The device of claim 14, further comprising:
   a controller to control a color temperature of the emitted light from the plurality of OLEDs.

16. The device of claim 1, wherein a surface of the plurality of OLEDs is reflective to visible light.

17. The device of claim 1, wherein the light directing structure is a polyhedral structure.

18. The device of claim 17, wherein the polyhedral structure is selected from the group consisting of: a triangular structure, a tetragonal structure, a pentagonal structure, a hexagonal structure, a heptagonal structure, an octagonal structure, a nonagonal structure, a decagonal structure, a hendecagonal structure, and a dodecagonal structure.

19. The device of claim 1, wherein the light directing structure is a parabolic structure.

20. The device of claim 19, wherein the parabolic structure is selected from the group consisting of: a simple paraboloid, a circular paraboloid, an elliptic paraboloid, a hyperbolic paraboloid, and a compound paraboloid.

* * * * *